United States Patent
Lee et al.

(10) Patent No.: US 12,557,554 B2
(45) Date of Patent: Feb. 17, 2026

(54) METHODS FOR FABRICATING MRAM WITH VOID FREE INTERLAYER DIELECTRIC

(71) Applicant: HeFeChip Corporation Limited, Hong Kong (CN)

(72) Inventors: Chih Yuan Lee, Taoyuan (TW); Hong-Hui Hsu, Zhubei (TW); Yiheng Xu, Clifton Park, NY (US); Laertis Economikos, Wappingers Falls, NY (US); Chao-Hsu Chang, Ballston Lake, NY (US); Wei-Chuan Chen, Scarsdale, NY (US)

(73) Assignee: HEFECHIP CORPORATION LIMITED, Hong Kong (CN)

( * ) Notice: Subject to any disclaimer, the term of this patent is extended or adjusted under 35 U.S.C. 154(b) by 431 days.

(21) Appl. No.: 18/336,759

(22) Filed: Jun. 16, 2023

(65) Prior Publication Data

US 2024/0423093 A1 Dec. 19, 2024

(51) Int. Cl.
| | |
|---|---|
| *H10N 50/01* | (2023.01) |
| *H10B 61/00* | (2023.01) |
| *H10N 50/20* | (2023.01) |
| *H10N 50/80* | (2023.01) |

(52) U.S. Cl.
CPC ............. *H10N 50/01* (2023.02); *H10B 61/00* (2023.02); *H10N 50/20* (2023.02); *H10N 50/80* (2023.02)

(58) Field of Classification Search
CPC ........ H10N 50/01; H10N 50/80; H10N 50/20; H10B 61/00

USPC .................................................. 438/3
See application file for complete search history.

(56) References Cited

U.S. PATENT DOCUMENTS

| | | | |
|---|---|---|---|
| 5,270,264 A | 12/1993 | Andideh et al. | |
| 8,133,797 B2 | 3/2012 | Van Schravendijk et al. | |
| 10,636,963 B2 * | 4/2020 | Dai | H10N 50/85 |
| 2019/0157344 A1 * | 5/2019 | Wei | H01L 21/762 |
| 2021/0050220 A1 * | 2/2021 | Chen | H10N 50/01 |
| 2021/0126051 A1 * | 4/2021 | Dutta | H10B 61/00 |
| 2022/0310907 A1 * | 9/2022 | Hsiao | H10N 50/85 |
| 2022/0328759 A1 * | 10/2022 | Yang | H10N 50/85 |
| 2024/0188446 A1 * | 6/2024 | Katakam | G11C 11/161 |
| 2024/0206345 A1 * | 6/2024 | Dutta | H10N 50/10 |
| 2025/0266070 A1 * | 8/2025 | Song | G01R 33/093 |

* cited by examiner

*Primary Examiner* — Jami Valentine Miller
(74) *Attorney, Agent, or Firm* — MUNCY, GEISSLER, OLDS & LOWE, P.C.

(57) ABSTRACT

A method for fabricating an MRAM device is disclosed. The method includes: depositing a first dielectric layer and a second dielectric layer over a semiconductor substrate; depositing a bottom electrode layer over the second dielectric layer, and forming an MTJ stack and a hard mask layer over the bottom electrode layer; patterning the hard mask layer and forming at least one MTJ pillar by etching the MTJ stack with the patterned hard mask layer serving as a mask; depositing a first ILD layer over a top surface of the hard mask layer and on sidewalls of the hard mask layer and MTJ pillar; performing a first etch-back process on the first ILD layer, such that a surface of the first ILD layer on each side of the hard mask layer and the MTJ pillar forms a slope of 40°-70° with respect to a surface of the semiconductor substrate.

20 Claims, 14 Drawing Sheets

METHODS FOR FABRICATING MRAM WITH VOID FREE INTERLAYER DIELECTRIC

TECHNICAL FIELD

The present invention relates to the field of semiconductor technology and, in particular, to methods for fabricating MRAM with void free inter-layer dielectric (ILD).

BACKGROUND

Magnetoresistive random-access memory (MRAM) is a new type of non-volatile memory having a magnetic tunnel junction (MTJ) pillar as a main component. The MTJ pillar includes a stack of a pin layer, a tunneling barrier layer and a free layer. Typically, the pin layer has a fixed (or "pinned") magnetic orientation, while the free layer has a variable (or "free") magnetic orientation that can switch between two or more different magnetic polarities. Due to the magnetic tunnel effect, the electrical resistance of the MTJ pillar changes with the variable magnetic polarities. In operation, spin-transfer torque (STT) effect can be utilized to cause magnetic polarity change or switch which enables storage of data.

Figure 1:
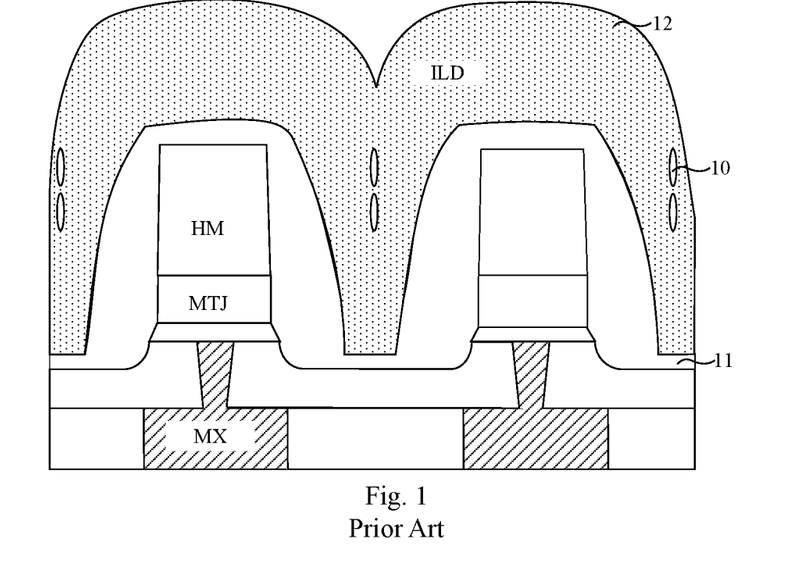
FIG. 1 is a schematic cross-sectional view of structure resulting from a conventional method for fabricating an MRAM device.

However, as shown in FIG. 1, in conventional MTJ pillars formation, there is a narrow high gap, between each MTJ pillar, and there is a problem of depositing an ILD layer 12 covering the encapsulation layer 11 and filling the gap.

For instance, these MTJ pillars laterally arranged on the substrate would be spaced apart at a reduced distance (or called pitch), which may be smaller than 40 nm, resulting in an increased aspect ratio (greater than 3) of the MTJ pillars. The smaller pitch and the higher aspect ratio cause a big challenge for process when depositing the ILD layer 12 in the gaps between adjacent MTJ pillars using a conventional CVD process. As a result, voids 10 (see FIG. 1) are easily formed in the ILD layer 12. The voids 10 may cause bit-line short, thereby reducing the MRAM yield.

Therefore, those skilled in the art are looking for an improved MRAM fabrication method to solve the problem of voids formation when depositing the ILD layer in the gap between adjacent MTJ pillars to increase the MRAM yield.

SUMMARY OF THE INVENTION

The present invention provides methods for fabricating an MRAM device with void free ILD.

In one aspect, the present invention provides a method for fabricating an MRAM device, comprising:
depositing a first dielectric layer and a second dielectric layer over a semiconductor substrate;
depositing a bottom electrode layer over the second dielectric layer, and forming a magnetic tunnel junction (MTJ) stack and a hard mask layer over the bottom electrode layer;
patterning the hard mask layer and forming at least one MTJ pillar by etching the MTJ stack with the patterned hard mask layer serving as a mask;
depositing a first interlayer dielectric (ILD) layer over a top surface of the hard mask layer and on sidewalls of the hard mask layer and MTJ pillar;
performing a first etch-back process on the first ILD layer, such that a surface of the first ILD layer on each side of the hard mask layer and the MTJ pillar forms a slope of 40°-70° with respect to a surface of the semiconductor substrate.

In another aspect, the present invention provides a further method for fabricating an MRAM device, comprising:
depositing a first dielectric layer and a second dielectric layer over a semiconductor substrate;
depositing a bottom electrode layer over the second dielectric layer, and forming a magnetic tunnel junction (MTJ) stack and a hard mask layer over the bottom electrode layer;
patterning the hard mask layer to define a location for the MTJ pillar and forming at least one MTJ pillar by etching the MTJ stack with the patterned hard mask layer serving as a mask;
depositing a first interlayer dielectric (ILD) layer over a top surface of the hard mask layer and on sidewalls of the hard mask layer and MTJ pillar;
depositing a second ILD layer over the first ILD layer;
performing an etch-back process on the second ILD layer, such that a surface of the second ILD layer on each side of the hard mask layer and the MTJ pillar forms a slope of 40°-70° with respect to a surface of the semiconductor substrate.

According to the methods provided in the present invention, voids to be formed due to the limitation of gap-filling capability for traditional ILD film and higher aspect ratio can be avoided by etching back the ILD layer to form a slope ranging from 40° to 70° before a further ILD layer is deposited, thus achieving a voids free ILD layer.

DETAILED DESCRIPTION

Methods for fabricating a magnetoresistive random access memory (MRAM) according to preferred embodiments of the present invention will be described in greater detail below with reference to the accompanying drawings. Note that the figures are provided in a very simplified form not necessarily drawn to exact scale for the only purpose of facilitating easy and clear description of the embodiments. Additionally, the spatially relative terms are intended to encompass different orientations of the device in use or operation in addition to the orientation depicted in the figures. For example, if the device in the figures is inverted or otherwise oriented (e.g., rotated), the exemplary term "over" can encompass an orientation of "under" and other orientations. Throughout the drawings, if any component is identical to a labeled one, although such components may be easily identifiable in all the figures, in order for a more clear description of labels to be obtained, not all identical components are labeled and described in the following description and accompanying drawings.

In an MRAM, one or more MTJ pillars may be formed over a semiconductor substrate. A multitude of such MTJ pillars, which are laterally arranged, may be formed. At advanced process nodes, these MTJ pillars would be spaced apart at a reduced pitch and have an increased aspect ratio. Due to the limitation of gap-filling capability for traditional ILD film and higher aspect ratio, voids tend to be formed after ILD layer is deposited in the gap between adjacent MTJ pillars. This can result in yield issues like bit-line short after top contact formation.

Embodiments of the present invention relate to methods for fabricating an MRAM device, in which after an ILD layer is deposited to cover the MTJ pillars and the gap between adjacent MTJ pillars, the ILD layer is etched to form a slope of 40°-70°, so as to allow a further ILD layer to be filled without voids, reducing the risk of bit-line short of the MRAM.

Embodiment I

FIGS. 2a to 2i are schematic cross-sectional views of structures resulting from multiple steps in a method for fabricating a MRAM according to a first embodiment of the present invention.

Figure 2A:
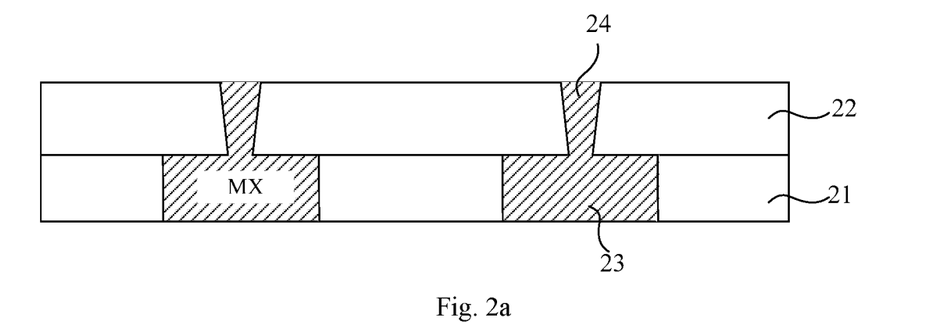
FIGS. 2a to 2k are schematic cross-sectional views of structures resulting from multiple steps in a method for fabricating an MRAM according to a first embodiment of the present invention.

As shown in FIG. 2a, at first, dielectric layer 21 and 22 are formed over a semiconductor substrate (not shown), wherein a bottom metal layer $M_x$ is formed in the dielectric layer 21 and one or more bottom electrode vias 24 extending through the dielectric layer 22 are formed.

The bottom metal layer $M_x$ may be a metal interconnect layer over the semiconductor substrate and is therefore labeled with the subscript "x".

The dielectric layers 21 and 22 may be made of traditional ILD materials, for example, $SiO_2$, low k dielectric material or any other suitable materials. The bottom electrode via 24 and the bottom metal layer 23 may be made of Cu, W, CuCo, CoRu or other suitable metal material.

Figure 2B:
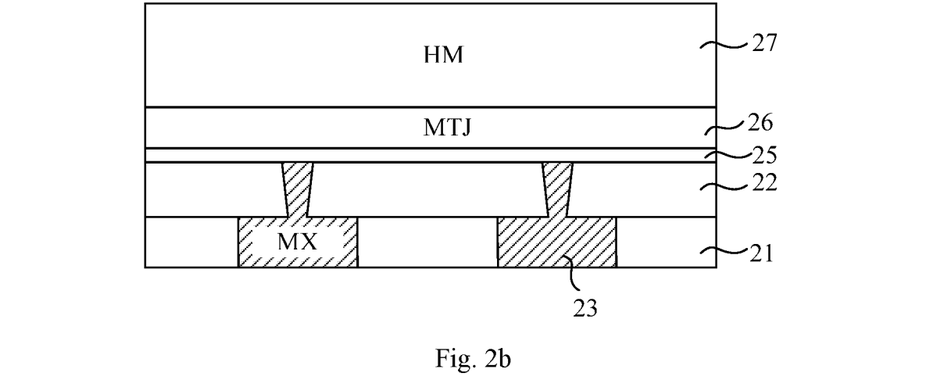

Referring to FIG. 2b, successively depositing a bottom electrode layer 25, an MTJ stack 26 and a hard mask (HM) layer 27 over the dielectric layer 22, wherein the bottom electrode layer 25 is used to connect the MTJ stack to the underlying bottom electrode vias 24.

The MTJ stack 26 includes various functional layers required by an MTJ component and is intended to be processed to form the MTJ pillars. As an example, the MTJ stack 26 may include a seed layer (SL), a pin layer (PL), a tunneling barrier layer, a free layer (FL) and a cap layer. These functional layers may be formed of known materials. The hard mask layer 27 is made of a metal material, for example, Ti, TiN, Ta or TaN.

Figure 2C:
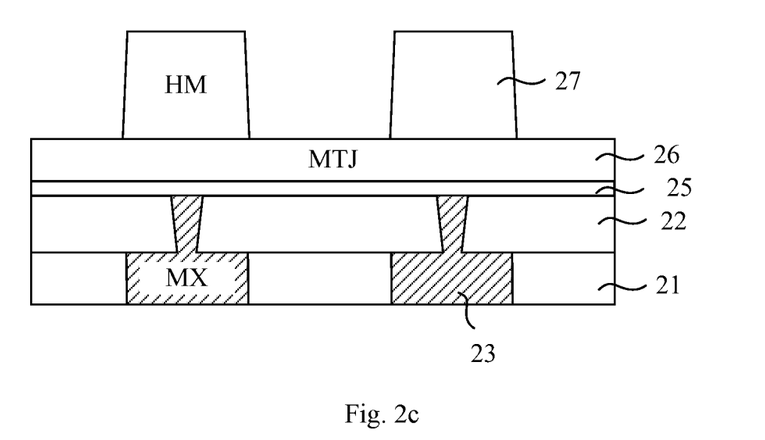

Referring to FIG. 2c, the hard mask layer is then patterned by photolithography and etching to define a location for the MTJ pillars.

Figure 2D:
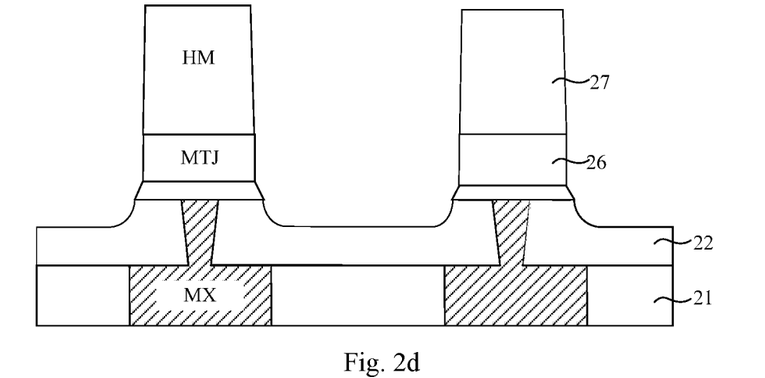

Referring to FIG. 2d, with the patterned hard mask layer 27 serving as a mask, an etching is carried out to remove a portion of the MTJ stack 26, to form the MTJ pillars aligned with the bottom electrode vias 24. The etching may be implemented as a reactive ion etching (RIE) or an ion-beam etching (IBE). Sidewalls of the MTJ pillars are substantially perpendicular to a top surface of the semiconductor substrate.

Figure 2E:
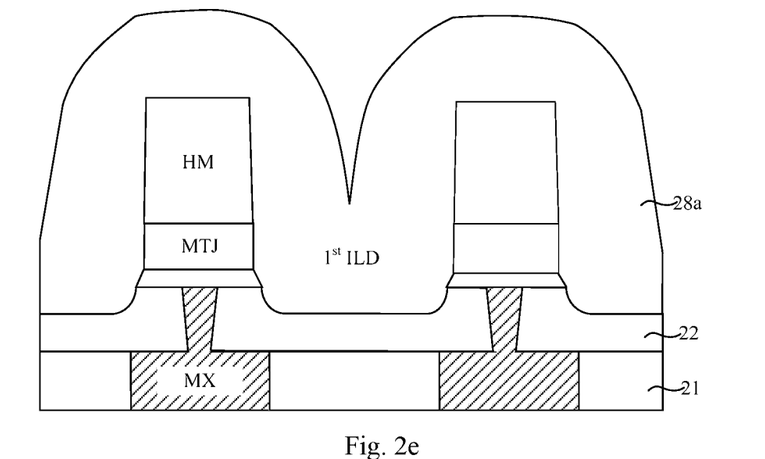

Referring to FIG. 2e, depositing an encapsulation layer 28a covering top and sidewalls of the HM layer and MTJ pillars. The encapsulation layer 28a may be formed from dielectric materials, such as: $SiO_2$, SiN, SiON, SiC, SiCN, or low-k, or the above material doped with Hf, Zr, or Boron. Herein, the encapsulation layer may be referred to as a first ILD layer. The first ILD layer may have a thickness ranging from 5 nm-60 nm and can be deposited by using a low damage process, such as: plasma enhanced chemical vapor deposition (PE-CVD), physical vapor deposition (PVD) or atomic layer deposition (ALD). By optionally doping the first ILD layer with the material of the MTJ pillars (e.g., Hf, Zr or Boron), the doped elements may protect or repair the MTJ, thereby improving the MTJ device performance.

Figure 2F:
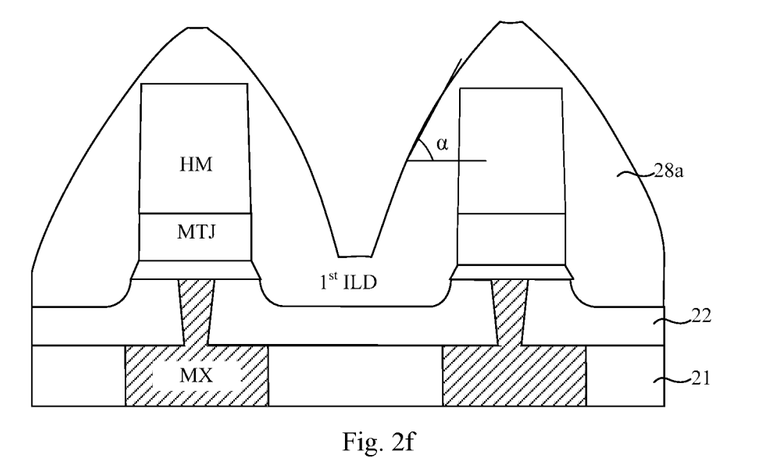

Referring to FIG. 2f, etching back the first ILD layer 28a to make the sidewalls of the first ILD layer have a slope angle $\alpha$ of 40°-70°. Here, the angle $\alpha$ refers to an angle defined by a sidewall of the ILD layer with respect to the surface of the substrate. This etch back step can be performed by RIE or IBE.

Figure 2G:
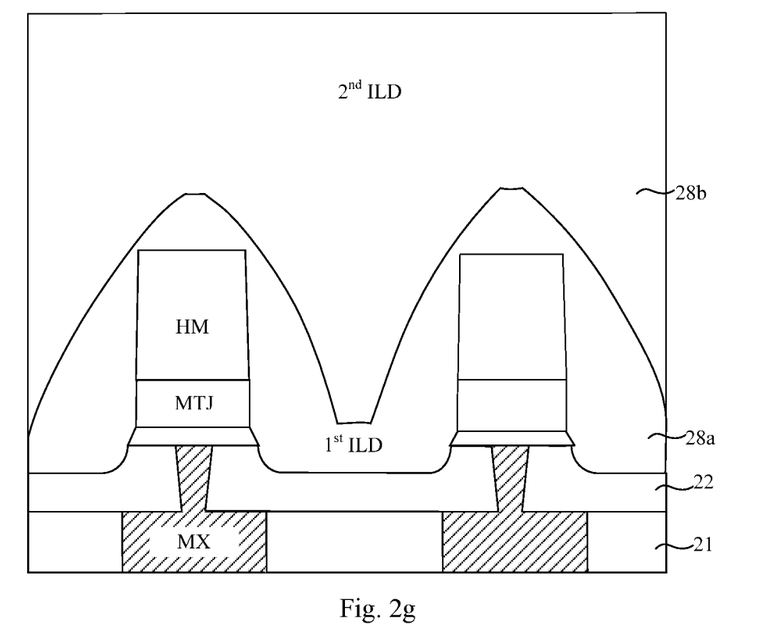

Referring to FIG. 2g, a second ILD layer 28b is deposited to cover the first ILD layer 28a. Afterwards, the top surface of the second ILD layer may be planarized by chemical mechanical polishing (CMP). The second ILD layer 28b and first ILD layer 28a are preferably made of the same material.

When the first ILD layer 28a is etched to form a sidewall with a slope of 40°-70°, the gap between adjacent MTJ pillars can have a smaller aspect ratio compared to the conventional method, so that the gaps can be better filled by the second ILD layer 28b, avoiding the occurrence of the voids, further avoiding the bit-line short of the MRAM.

Subsequent to the formation of the ILD layers 28a and 28b covering the HM layer and perfectly filling the gaps between adjacent MTJ pillars, a top contact terminal is to be deposited.

Figure 2H:
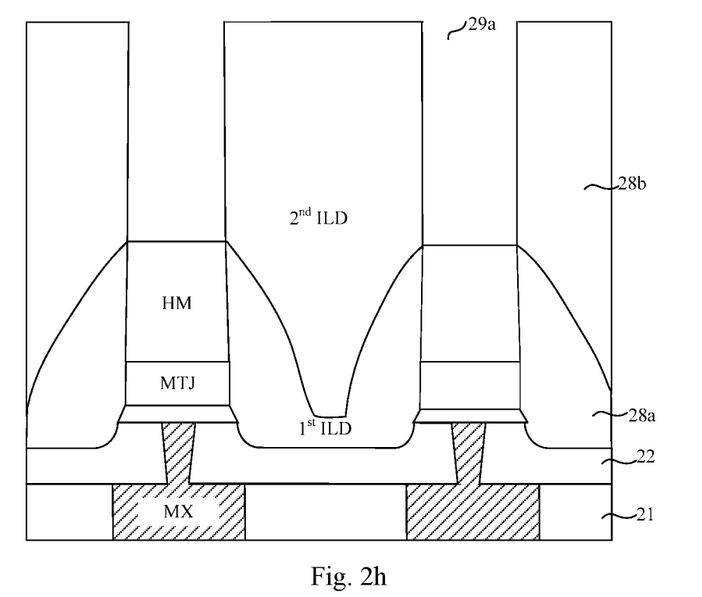
Figure 2I:
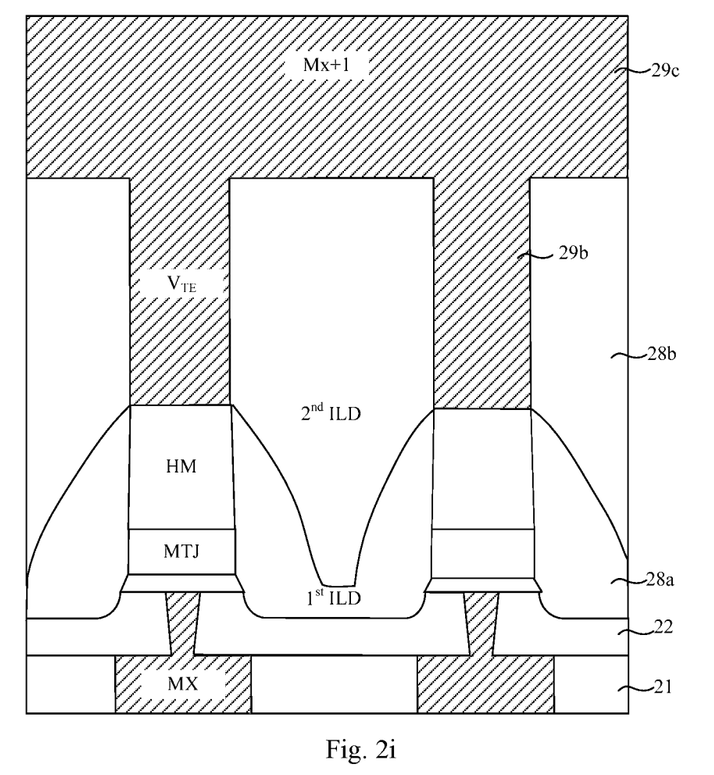

FIGS. 2h-2i show a method to form the top contact terminal.

Referring to FIG. 2h, photolithography and etching processes are performed to form top electrode vias 29a aligned with the hard mask layers and exposing the hard mask layers. Here, the hard mask layers serve as the top electrodes for the MTJ pillars. The top electrode via 29a may have a width equal to or narrower than the MTJ pillar, and the ILD layer 28b is exposed in the top electrode via 29a.

As shown in FIG. 2i, a metal material is then filled in the top electrode vias 29a to form top electrode contacts 29b and deposited on the top surface of the second ILD layer 28b to form a top metal layer $M_{x+1}$ 29c. Then, the top metal layer $M_{x+1}$ may be planarized by chemical mechanical polishing (CMP). The top metal layer $M_{x+1}$ serves as a top contact terminal connected to the MTJ pillars through the top electrode contact 29b. The material of the top metal layer $M_{x+1}$ and top electrode contact may be as same as the metal material of the bottom metal layer $M_x$ and the bottom electrode 25.

Figure 2J:
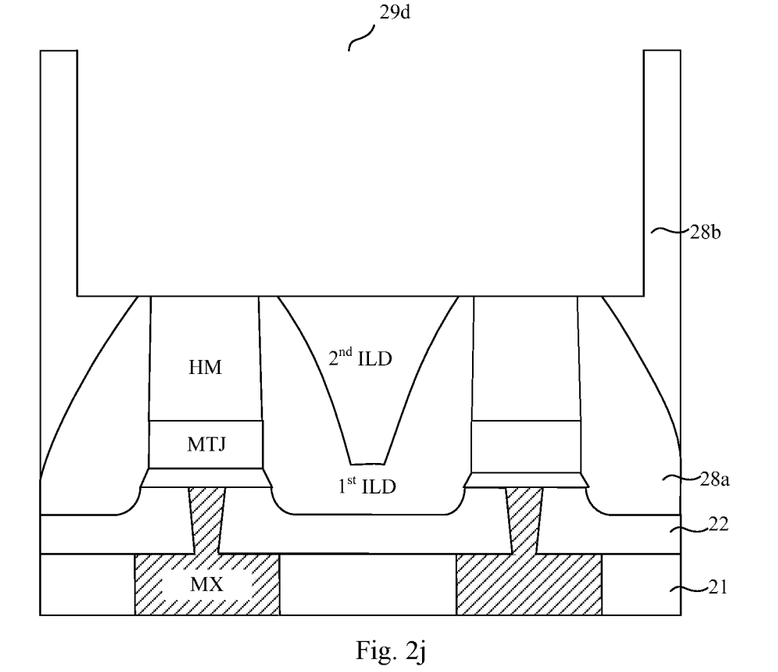
Figure 2K:
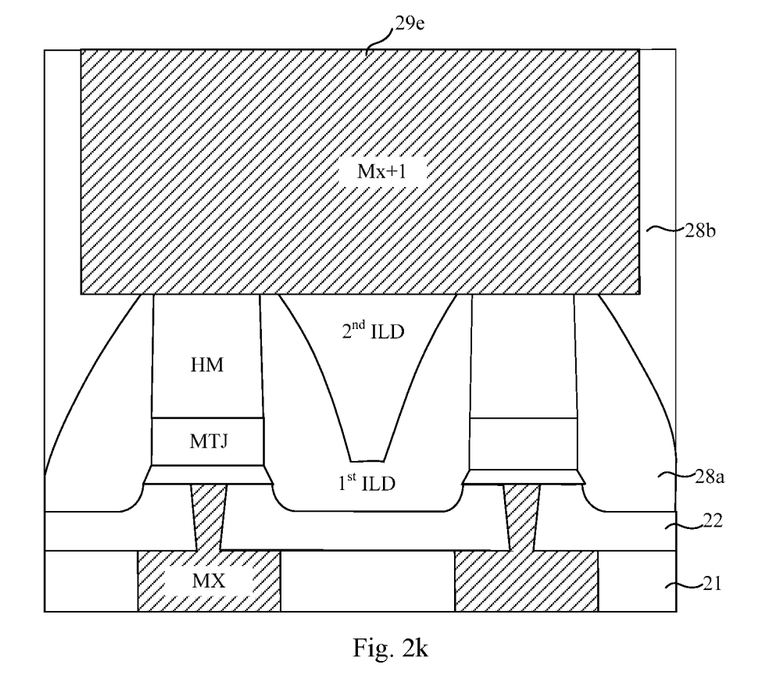

An alternative method to form the top contact terminal is shown in FIGS. 2j-2k.

As shown in FIG. 2j, a portion of the second and first ILD layers are etched away to form a trench 29d which exposes the top electrode, i.e. the HM layer. Here, the etching can be performed by RIE.

As shown in FIG. 2k, a metal material is then filled in the trench to form a top metal layer $M_{x+1}$ 29e. Afterward, the top metal layer $M_{x+1}$ may be planarized by CMP. The top metal layer serves as a top contact terminal directly connected to the MTJ pillars. The material to form the top metal layer $M_{x+1}$ may be as same as the metal material to form the bottom electrode layer and $M_x$.

The top contact terminal formed by the method as shown in FIGS. 2h-2i is conventional process to form top electrode contacts and top metal layer. The damascene process can be used in another embodiment for the top contact terminal directly formed from the top metal layer as shown in FIGS. 2*j*-2*k*.

Embodiment II

A method for fabricating an MRAM device according to a second embodiment of the present invention will be described below with reference to FIGS. 3*e*, 3*f*-3*l*, in which the first ILD has not been etched.

As the first several steps of this Embodiment II are the same processes shown in FIGS. 2*a*-2*d* and described in Embodiment I, the details of these steps of Embodiment II will not be repeated and reference can be made to FIGS. 2*a*-2*d*. Only the differences between Embodiment II and Embodiment I will be described in great detail below.

Figure 3E:
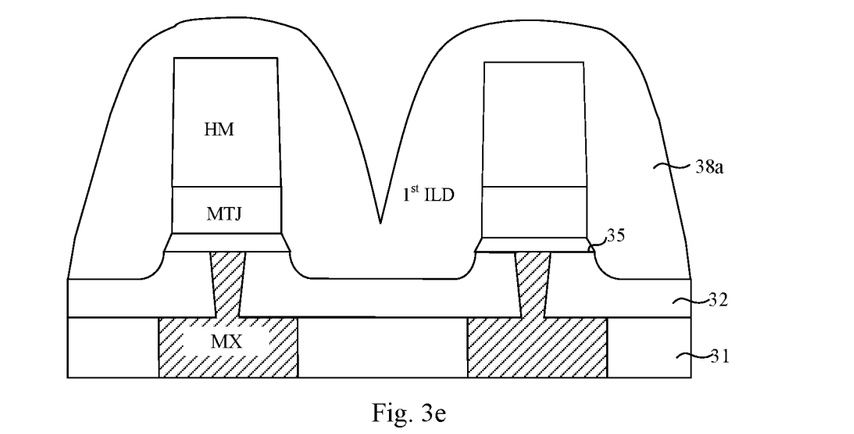
FIGS. 3e to 3l are schematic cross-sectional views of structures resulting from multiple steps in a method for fabricating an MRAM according to a second embodiment of the present invention.

Referring to FIG. 3*e*, after MTJ pillars have been etched by using the HM layer as a mask, depositing an encapsulation layer 38*a* covering top and sidewalls of the HM layer and MTJ pillars. The encapsulation layer 38*a* may be formed from dielectric materials, such as: SiN, SiON, SiC, or the above material doped with Hf, Zr, or Boron. Herein, the encapsulation layer 38*a* may be referred to as a first ILD layer. The first ILD layer may have a thickness ranging from 5 nm-60 nm and can be deposited by using a low damage process, such as: plasma enhanced chemical vapor deposition (PE-CVD), physical vapor deposition (PVD) or atomic layer deposition (ALD). By optionally doping the first ILD layer with the material of the MTJ pillars (e.g., Hf, Zr or Boron), the doped elements may protect or repair the MTJ, thereby improving the MTJ device performance.

Figure 3F:
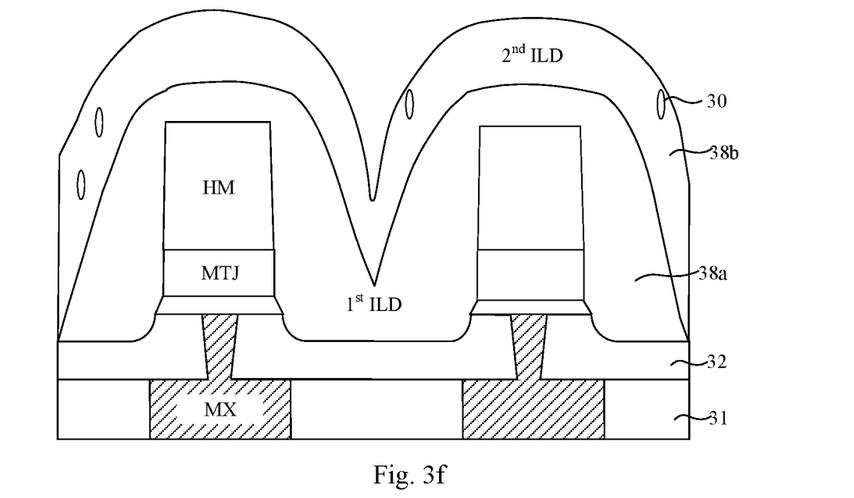

Referring to FIG. 3*f*, successively depositing a second ILD layer 38*b* over the first ILD layer 38*a*. The second ILD layer may be made of $SiO_2$, or low-k dielectric material, or any other suitable materials. Due to the limited CVD dielectric gap filling capability and higher aspect ratio of the MTJ pillar, voids 30 may be formed in the second ILD layer between MTJ pillars.

Figure 3G:
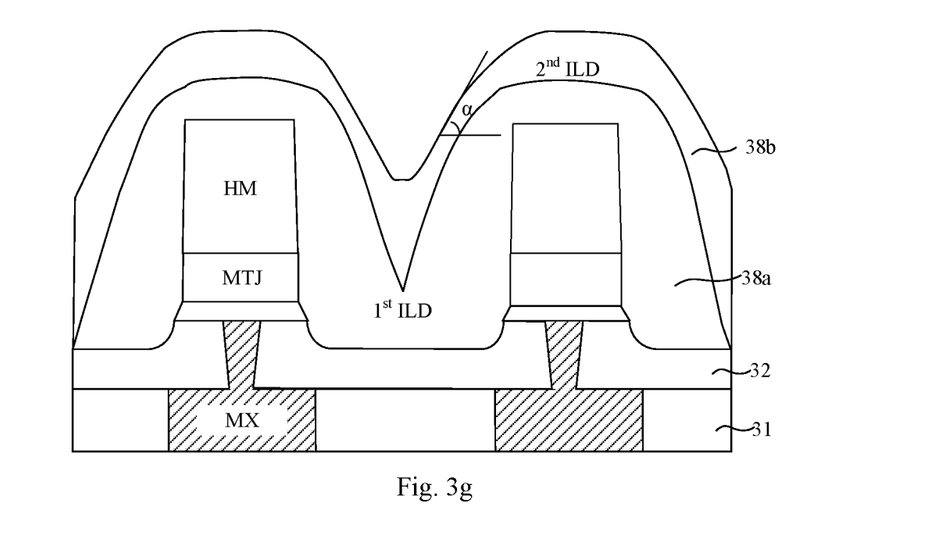

Referring to FIG. 3*g*, in order to remove the voids formed in the second ILD layer 38*b*, an etch back process is performed on the second ILD layer 38*b*. After etching back, the sidewalls of the second ILD layer 38*b* have a slope angle α of 40°-70°. Here, the angle α refers to an angle defined by a sidewall of the second ILD layer 38*b* with respect to the surface of the substrate. This etch back can be performed by RIE or IBE.

Figure 3H:
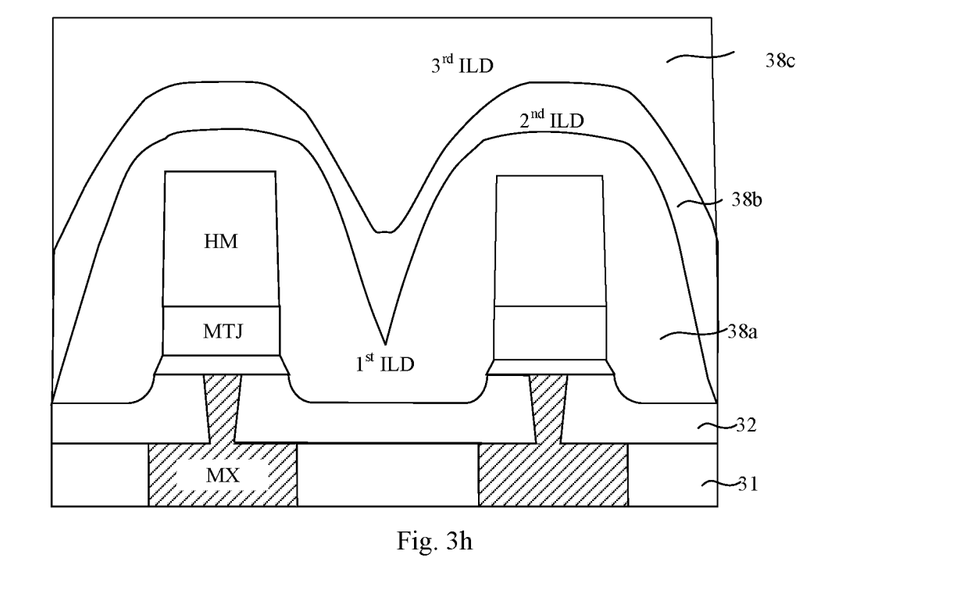

Referring to FIG. 3*h*, a third ILD layer 38*c* is then deposited to cover the second ILD layer 38*b*. Afterwards, the top surface of the third ILD layer 38*c* may be planarized by CMP. The third ILD layer 38*c* and second ILD layer 38*b* are preferably made of the same material. Since the voids 30 previously formed in the second ILD layer 38*b* are removed after etching back, and the aspect ratio between MTJ pillars is smaller compared to the conventional method, when the third ILD layer 38*c* is deposited, no voids are formed in the gaps, avoiding the bit-line short of the MRAM.

Subsequent to the formation of the ILD layers 38*a*, 38*b* and 38*c* covering the hard mask and perfectly filling the gaps between adjacent MTJ pillars, a top contact terminal is to be deposited.

FIGS. 3*i*-3*l* show a method to form the top contact terminal.

Figure 3I:
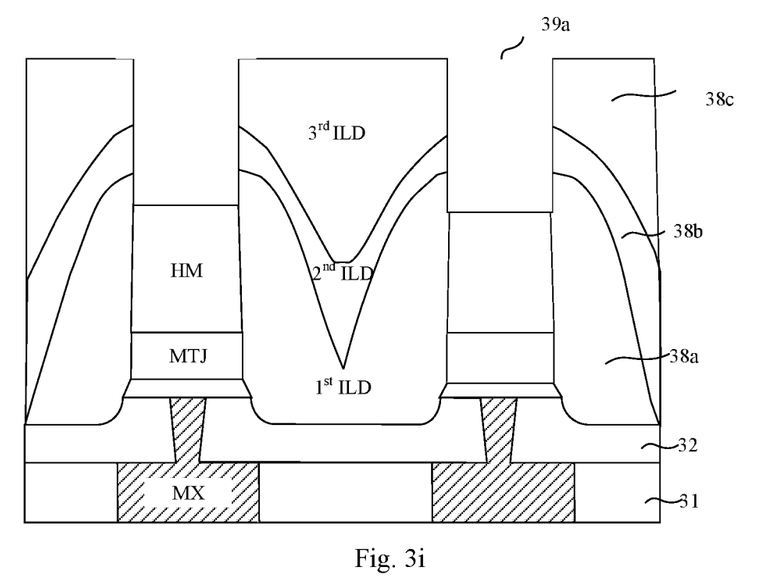

Referring to FIG. 3*i*, photolithography and etching processes are performed to form top electrode vias 39*a* aligned with the hard mask layers and exposing the HM layers. Here, the hard mask layers serve as the top electrodes for the MTJ pillars. The top electrode via 39*a* may have a width equal to or narrower than the MTJ pillar, and the ILD layers 38*a*, 38*c* are exposed in the top electrode via 39*a*.

Figure 3J:
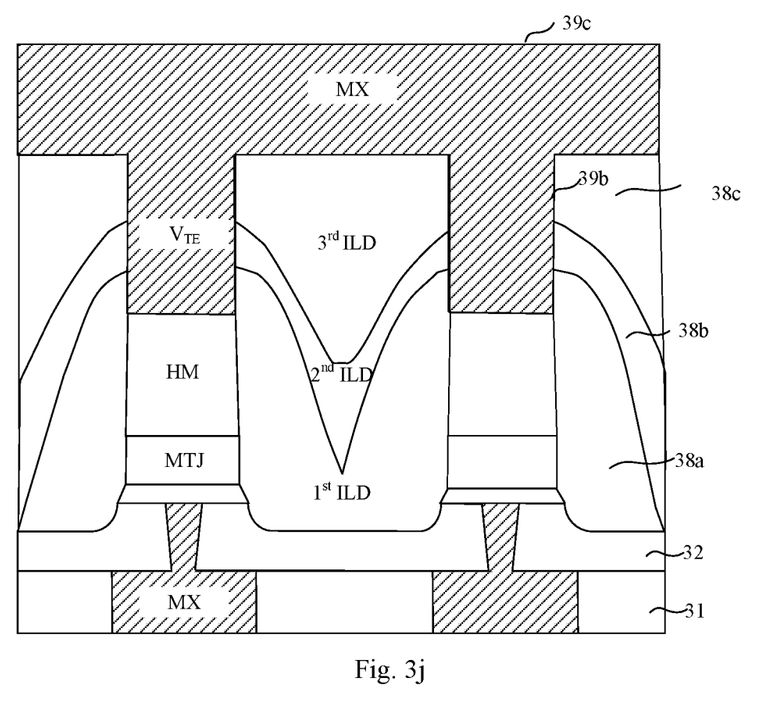

As shown in FIG. 3*j*, a metal material is then filled in the top electrode vias 39*a* to form top electrode contacts 39*b* and deposited on the top surface of the third ILD layer 38*c* to form a top metal layer $M_{x+1}$ 39*c*. Then, the top metal layer $M_{x+1}$ may be planarized by CMP. The top metal layer $M_{x+1}$ serves as a top contact terminal connected to the MTJ pillars through the top electrode contact 39*b*. The material of the top metal layer $M_{x+1}$ and top electrode contact 39*b* may be as same as the metal material of the bottom metal layer Mx and the bottom electrode 35.

Figure 3K:
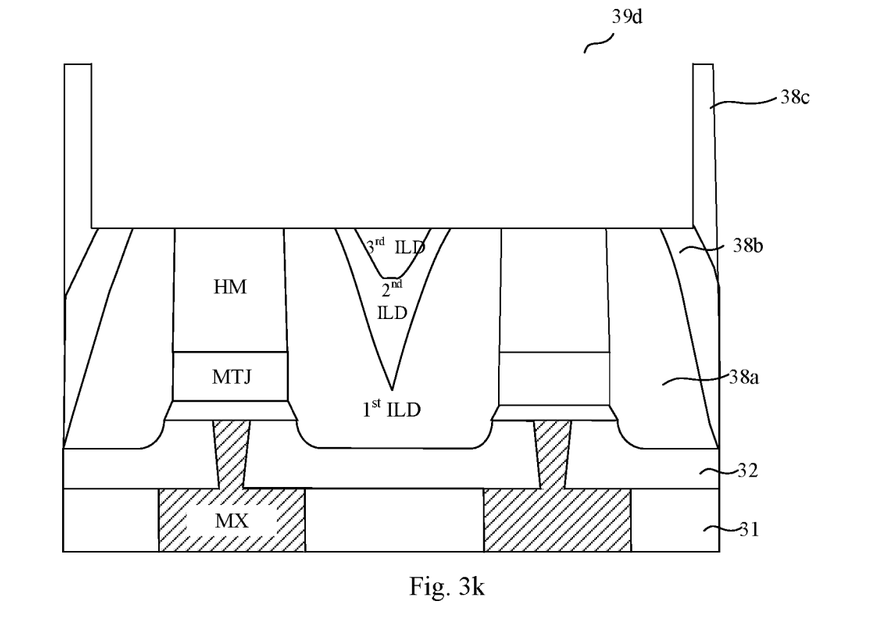
Figure 3L:
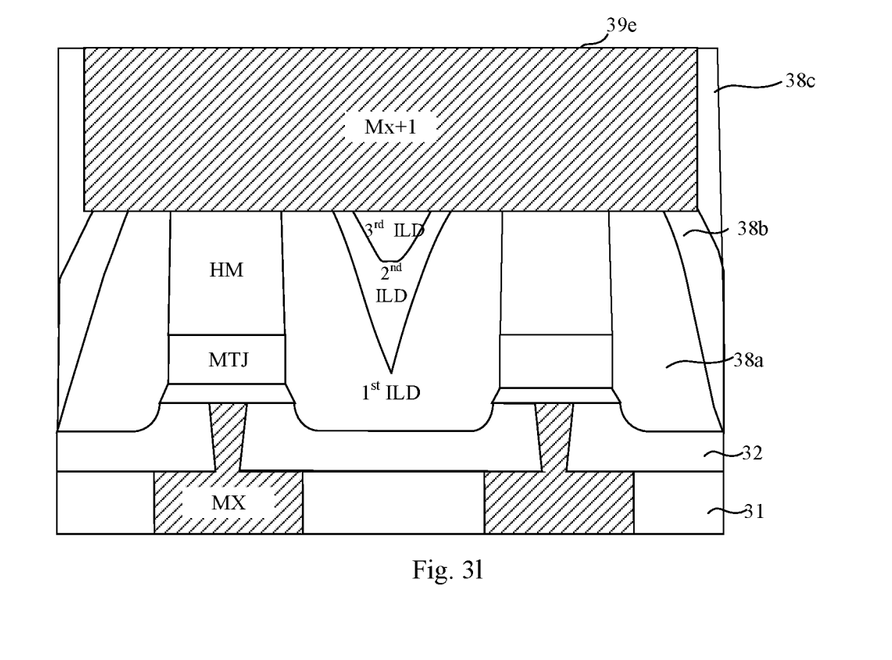

An alternative method to form the top contact terminal is shown in FIGS. 3*k*-3*l*.

As shown in FIG. 3*k*, a portion of the third, second and first ILD layers are etched away to form a trench 39*d* which exposes the top electrode, i.e. the HM layer. Here, the etching can be performed by RIE.

As shown in FIG. 3*l*, a metal material is then filled in the trench to form a top metal layer $M_{x+1}$ 39*e*. Afterward, the top metal layer $M_{x+1}$ may be planarized by CMP. The top metal layer serves as a top contact terminal directly connected to the MTJ pillars. The material to form the top metal layer $M_{x+1}$ may be as same as the metal material to form the bottom electrode layer and $M_x$.

Alternatively, as shown in FIG. 3*e*', before depositing the second ILD layer, another etch back may be performed on the first ILD layer 38*a* to thin down the first ILD layer to be a dome shape enclosing the hard mask layer and MTJ pillar. In this step, the first ILD layer 38*a* may be optionally etched back according to practical needs. And the remaining steps of the method for fabricating an MRAM with an etch back performed on the first ILD layer 38*a* can refer to FIGS. 3*f*-3*l*.

Embodiment III

A method for fabricating an MRAM device according to a third embodiment of the present invention will be described below with reference to FIGS. 4*e*-4*m*.

As the first several steps of this Embodiment III are the same processes shown in FIGS. 2*a*-2*d* and described in Embodiment I, the details of these steps of the Embodiment III will not be repeated and reference can be made to FIGS. 2*a*-2*d*. Only the differences between Embodiment III and Embodiment I will be described in great detail below.

Figure 4E:
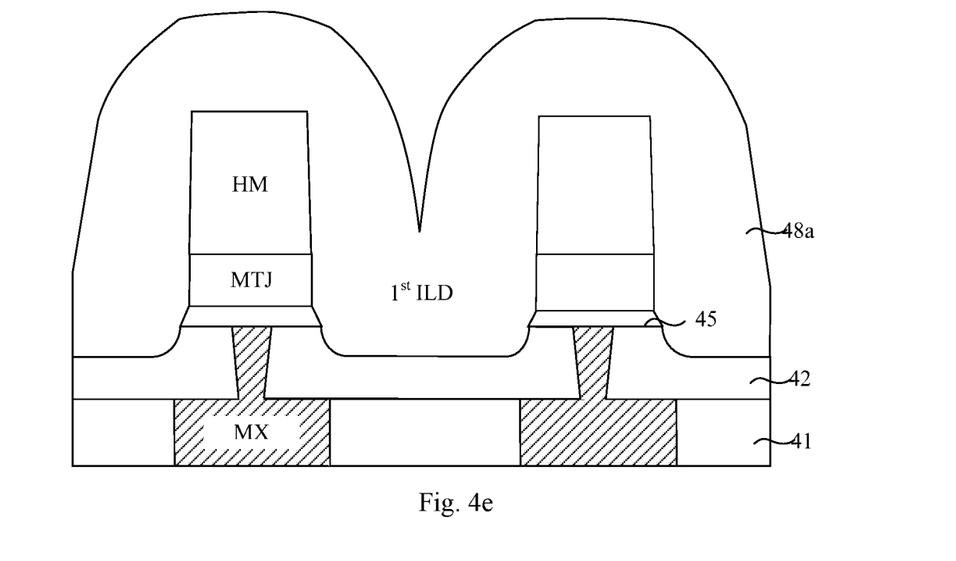
FIGS. 4e to 4m are schematic cross-sectional views of structures resulting from multiple steps in a method for fabricating an MRAM according to a third embodiment of the present invention.

Referring to FIG. 4*e*, after MTJ pillars have been etched by using the HM layer as a mask, depositing an encapsulation layer 48*a* covering top and sidewalls of the HM layer and MTJ pillars. The encapsulation layer 48*a* may be formed from dielectric materials, such as: SiN, SiON, SiC, or the above material doped with Hf, Zr, or Boron. Herein, the encapsulation layer 48*a* may be referred to as a first ILD layer. The first ILD layer may have a thickness ranging from 5 nm-60 nm and can be deposited by using a low damage process, such as: plasma enhanced chemical vapor deposition (PE-CVD), physical vapor deposition (PVD) or atomic layer deposition (ALD). By optionally doping the first ILD layer with the material of the MTJ pillars (e.g., Hf, Zr or Boron), the doped elements may protect or repair the MTJ, thereby improving the MTJ device performance.

Figure 4F:
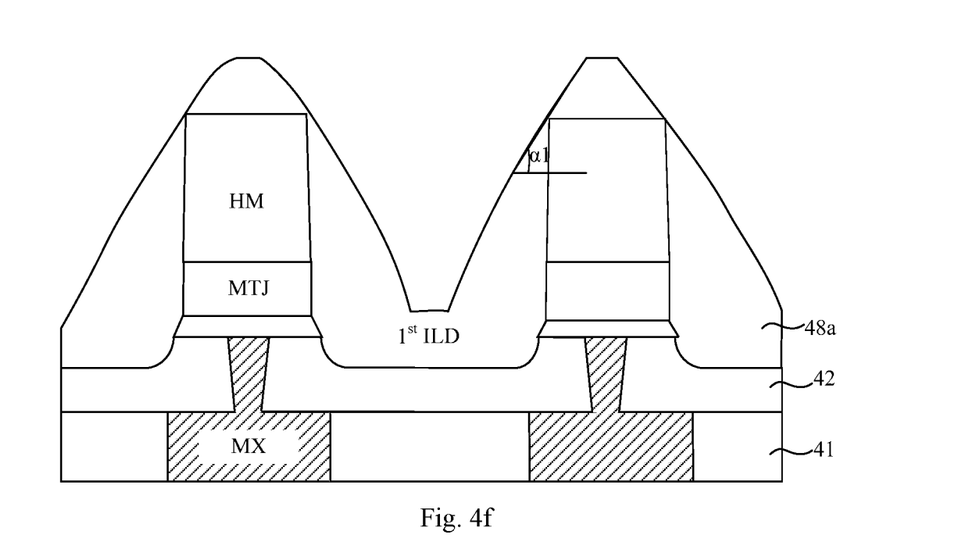

Referring to FIG. 4*f*, a first etching back is performed on the first ILD layer 48*a* to make the sidewalls of the first ILD layer have a slope angle α1 of 40°-70°. Here, the angle α1 refers to an angle defined by a sidewall of the first ILD layer 48*a* with respect to the surface of the substrate. This etch back can be performed by RIE or IBE.

Figure 4G:
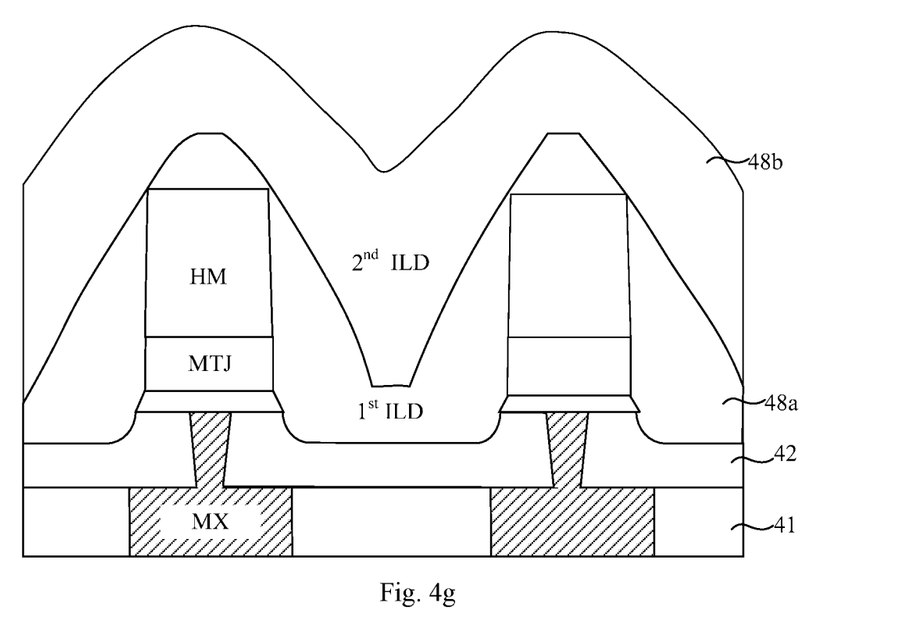
Figure 4H:
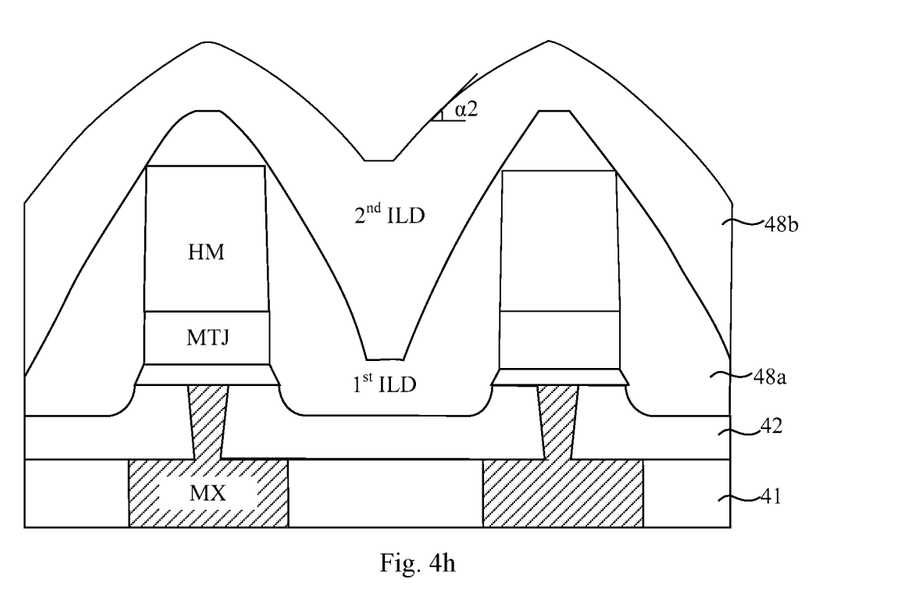

Referring to FIG. 4g, a second ILD layer 48b is deposited to cover the first ILD layer 48a. The second ILD layer may be made of $SiO_2$, or low-k dielectric material, or any other suitable materials. Referring to FIG. 4h, a second etch back is performed on the second ILD layer 48b to make the sidewalls of the second ILD layer have a slope angle α2 of 30°-60°. Here, the angle α2 also refers to an angle defined by a sidewall of the second ILD layer 48b with respect to the surface of the substrate. This etch back can be performed by RIE or IBE.

Figure 4I:
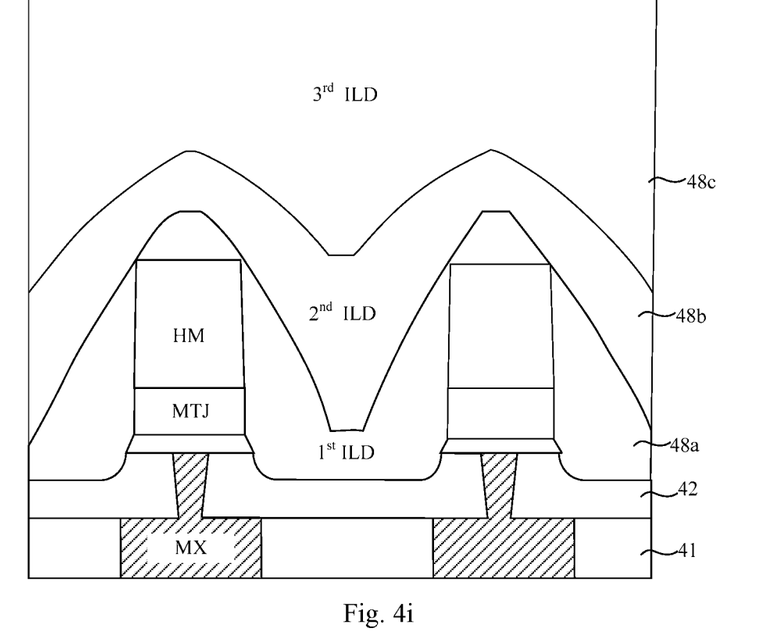

Referring to FIG. 4i, a third ILD layer 48c is then deposited to cover the second ILD layer 48b. Afterwards, the top surface of the third ILD layer 48c may be planarized by the CMP. The third ILD layer and second ILD layer are preferably made of the same material.

After the first and second etch back, voids formed in the ILD layers are removed, and a smaller aspect ratio between MTJ pillars is achieved. When the third ILD layer is deposited, no voids are formed in the ILD layers, avoiding the bit-line short of the MRAM.

Subsequent to the formation of the ILD layers 48a, 48b and 48c covering the HM layer and perfectly filling the gaps between adjacent MTJ pillars, a top contact terminal is to be deposited.

Figure 4J:
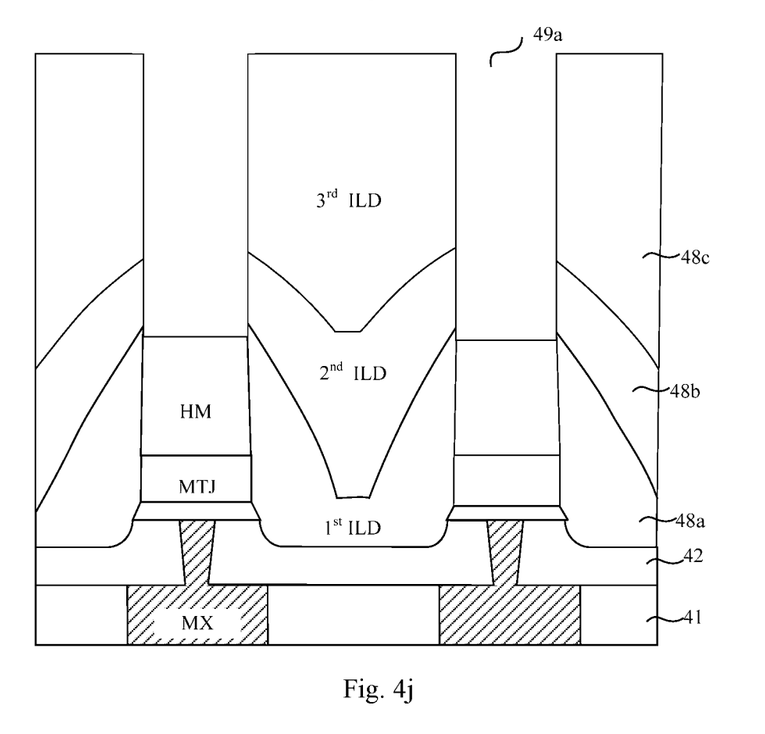
Figure 4K:
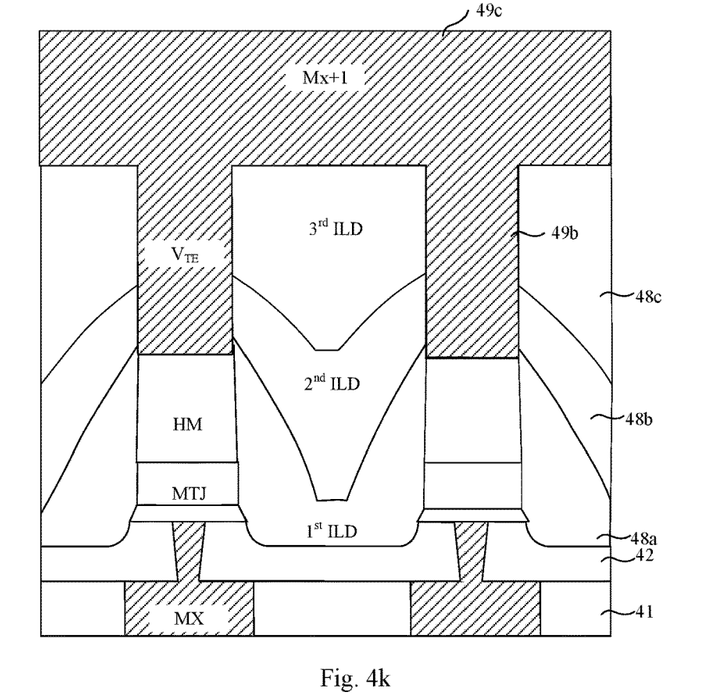

FIGS. 4j-4k show a method to form the top contact terminal.

Referring to FIG. 4j, photolithography and etching processes are performed to form top electrode vias 49a aligned with the hard mask layers and exposing the hard mask layers. Here, the hard mask layers serve as the top electrodes for the MTJ pillars. The top electrode via 49a may have a width equal to or narrower than the MTJ pillar, and the ILD layers 48a, 48b, 48c are exposed in the top electrode via 49a.

As shown in FIG. 4k a metal material is then filled in the top electrode vias 49a to form top electrode contacts 49b and deposited on the top surface of the third ILD layer 48c to form a top metal layer $M_{x+1}$ 49c. Then, the top metal layer $M_{x+1}$ may be planarized by CMP. The top metal layer $M_{x+1}$ serves as a top contact terminal connected to the MTJ pillars through the top electrode contact 49b. The material of the top metal layer $M_{x+1}$ and top electrode contact may be as same as the metal material of the bottom metal layer $M_x$ and the bottom electrode 45.

Figure 4L:
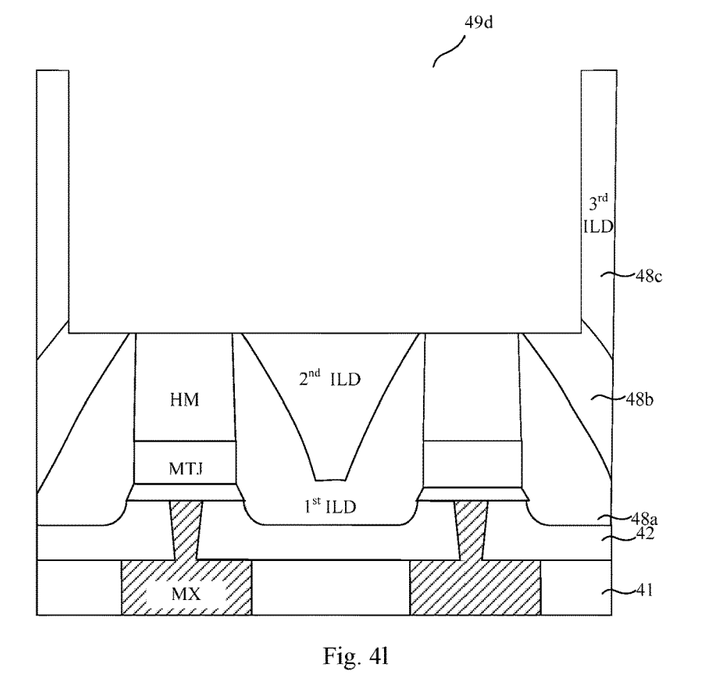
Figure 4M:
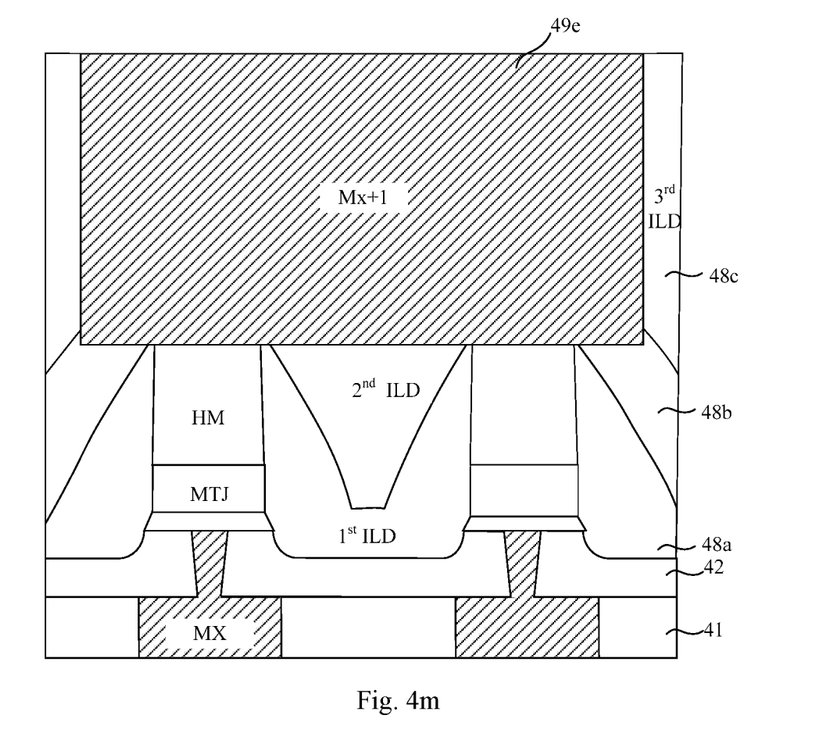

An alternative method to form the top contact terminal is shown in FIGS. 4l-4m.

As shown in FIG. 4l, a portion of the third, second and first ILD layers are etched away to form a trench 49d which exposes the top electrode, i.e. the HM layer. Here, the etching can be performed by RIE.

As shown in FIG. 4m, a metal material is then filled in the trench to form a top metal layer $M_{x+1}$ 49e. Afterward, the top metal layer $M_{x+1}$ may be planarized by CMP. The top metal layer serves as a top contact terminal directly connected to the MTJ pillars. The material to form the top metal layer $M_{x+1}$ may be as same as the metal material to form the bottom electrode layer and $M_x$.

Embodiments of the present invention provide methods for fabricating an MRAM device, comprising: depositing a first dielectric layer and a second dielectric layer over a semiconductor substrate; depositing a bottom electrode layer over the second dielectric layer, and forming a magnetic tunnel junction (MTJ) stack and a hard mask layer over the bottom electrode layer; patterning the hard mask layer and forming at least one MTJ pillar by etching the MTJ stack with the patterned hard mask layer serving as a mask; depositing a first interlayer dielectric (ILD) layer over a top surface of the hard mask layer and on sidewalls of the hard mask layer and MTJ pillar; performing a first etching back process on the first ILD layer, such that a surface of the first ILD layer on each side of the hard mask layer and the MTJ pillar forms a slope of 40°-70° with respect to a surface of the semiconductor substrate. Compared with conventional fabrication method, the ILD layer is etched to form a slope ranging from 40°-70° before a further ILD layer is deposited which can avoid or remove voids formed in gaps between adjacent MTJ pillars due to the limitation of gap-filling capability for traditional ILD film and higher aspect ratio, thus achieving voids free ILD layer and avoiding bit-line short of the MRAM.

It is to be noted that the embodiments disclosed herein are described in a progressive manner, with the description of each embodiment focusing on its differences from others. Reference can be made between the embodiments for their identical or similar parts.

The foregoing description is merely that of several preferred embodiments of the present invention and is not intended to limit the scope of the claims of the invention in any way. Any person of skill in the art may make various possible variations and changes to the disclosed embodiments in light of the methodologies and teachings disclosed hereinabove, without departing from the spirit and scope of the invention. Accordingly, any and all such simple variations, equivalent alternatives and modifications made to the foregoing embodiments based on the essence of the present invention without departing from the scope of the embodiments are intended to fall within the scope of protection of the invention.

What is claimed is:

1. A method for fabricating an MRAM device, comprising:
    depositing a first dielectric layer and a second dielectric layer over a semiconductor substrate;
    depositing a bottom electrode layer over the second dielectric layer, and forming a magnetic tunnel junction (MTJ) stack and a hard mask layer over the bottom electrode layer;
    patterning the hard mask layer and forming at least one MTJ pillar by etching the MTJ stack with the patterned hard mask layer serving as a mask;
    depositing a first interlayer dielectric (ILD) layer over a top surface of the hard mask layer and on sidewalls of the hard mask layer and MTJ pillar;
    performing a first etch-back process on the first ILD layer, such that a surface of the first ILD layer on each side of the hard mask layer and the MTJ pillar forms a slope of 40°-70° with respect to a surface of the semiconductor substrate.

2. The method of claim 1, wherein after the first etch-back process, the method further comprises:
    depositing a second ILD layer over the first ILD layer; and
    planarizing a top surface of the second ILD layer by a chemical mechanical polishing.

3. The method of claim 2, wherein after planarizing the top surface of the second ILD layer, the method further comprises:
    etching the second and first ILD layers to form a top electrode via aligned with the hard mask layer and exposing the hard mask layer;
    depositing a metal material in the top electrode via and on a top surface of the second ILD layer to form a top electrode contact and a top metal layer, respectively.

4. The method of claim 1, wherein after the first etch-back process, the method further comprises:
    depositing a second ILD layer over the first ILD layer;

performing a second etch-back process on the second ILD layer, such that a surface of the second ILD layer on each side of the hard mask layer and the MTJ pillar forms a slope of 30°-60° with respect to the surface of the semiconductor substrate.

5. The method of claim 4, wherein after the second etch-back process, the method further comprises:
depositing a third ILD layer over the second ILD layer; and
planarizing a top surface of the third ILD layer by a chemical mechanical polishing.

6. The method of claim 5, wherein after planarizing the top surface of the third ILD layer, the method further comprises:
etching the third, second and first ILD layers to form a top electrode via aligned with the hard mask layer and exposing the hard mask layer;
depositing a metal material in the top electrode via and on a top surface of the third ILD layer to form a top electrode contact and a top metal layer, respectively.

7. The method of claim 1, wherein the first ILD layer is made of any one of SiN, SiON and SiC, or a combination thereof.

8. The method of claim 1, wherein the first ILD layer is doped with Hf, Zr, or Boron.

9. The method of claim 5, wherein the third ILD layer is made of a material same as the second ILD layer.

10. The method of claim 1, wherein the first ILD layer has a thickness ranging from 5 nm-60 nm.

11. A method for fabricating an MRAM device, comprising:
depositing a first dielectric layer and a second dielectric layer over a semiconductor substrate;
depositing a bottom electrode layer over the second dielectric layer, and forming a magnetic tunnel junction (MTJ) stack and a hard mask layer over the bottom electrode layer;
patterning the hard mask layer to define a location for the MTJ pillar and forming at least one MTJ pillar by etching the MTJ stack with the patterned hard mask layer serving as a mask;
depositing a first interlayer dielectric (ILD) layer over a top surface of the hard mask layer and on sidewalls of the hard mask layer and MTJ pillar;
depositing a second ILD layer over the first ILD layer;
performing an etch-back process on the second ILD layer, such that a surface of the second ILD layer on each side of the hard mask layer and the MTJ pillar forms a slope of 40°-70° with respect to a surface of the semiconductor substrate.

12. The method of claim 11, wherein after the etch-back process, the method further comprises:
depositing a third ILD layer over the second ILD layer; and
planarizing a top surface of the third ILD layer by a chemical mechanical polishing.

13. The method of claim 12, wherein after planarizing the top surface of the third ILD layer, the method further comprises:
etching the third, second and first ILD layers to form a top electrode via aligned with the hard mask layer and exposing the hard mask layer;
depositing a metal material in the top electrode via and on the top surface of the third ILD layer to form a top electrode contact and a top metal layer, respectively.

14. The method of claim 13, wherein after depositing the first ILD layer and before depositing the second ILD layer, another etch-back process is performed on the first ILD layer to trim the first ILD layer to have a dome shape enclosing the hard mask layer and MTJ pillar.

15. The method of claim 11, wherein the first ILD is made of any one of SiN, SiON, SiC, or a combination thereof.

16. The method of claim 11, wherein the first ILD is doped with Hf, Zr, or Boron.

17. The method of claim 11, wherein the first ILD layer has a thickness ranging from 5 nm-60 nm.

18. The method of claim 11, wherein a width of the top electrode via is smaller than a width of the hard mask layer.

19. The method of claim 11, wherein the hard mask is made of any one of Ti, TiN, Ta or TaN, or a combination thereof.

20. The method of claim 11, wherein the third ILD layer is made of a material same as the second ILD layer.

* * * * *